(12) United States Patent
Tian

(10) Patent No.: US 11,716,809 B2
(45) Date of Patent: Aug. 1, 2023

(54) DISPLAY DEVICE

(71) Applicant: WUHAN CHINA STAR OPTOELECTRONICS TECHNOLOGY CO., LTD., Hubei (CN)

(72) Inventor: Dong Tian, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 330 days.

(21) Appl. No.: 17/058,145

(22) PCT Filed: Oct. 30, 2020

(86) PCT No.: PCT/CN2020/125259
§ 371 (c)(1),
(2) Date: Nov. 24, 2020

(87) PCT Pub. No.: WO2022/067937
PCT Pub. Date: Apr. 7, 2022

(65) Prior Publication Data
US 2022/0304140 A1  Sep. 22, 2022

(30) Foreign Application Priority Data

Sep. 29, 2020 (CN) .......................... 202011048583.7

(51) Int. Cl.
*H05K 1/18* (2006.01)
*H05K 1/02* (2006.01)
(52) U.S. Cl.
CPC ............. *H05K 1/028* (2013.01); *H05K 1/189* (2013.01); *H05K 2201/10128* (2013.01)

(58) Field of Classification Search
CPC ................... H05K 1/028; H05K 1/189; H05K 2201/10128
(Continued)

(56) References Cited

U.S. PATENT DOCUMENTS

| 2010/0060816 A1 | 3/2010 | Fukai et al. | |
| 2011/0187965 A1* | 8/2011 | Ooishi | G09F 13/04 361/749 |

(Continued)

FOREIGN PATENT DOCUMENTS

| CN | 1607895 A | 4/2005 |
| CN | 102466901 A | 5/2012 |

(Continued)

*Primary Examiner* — Binh B Tran
(74) *Attorney, Agent, or Firm* — PV IP PC; Wei Te Chung; Zhigang Ma

(57) ABSTRACT

A display device is provided, which includes a display panel including a first surface and a second surface of the display panel disposed opposite to each other; a backlight module including a first surface and a second surface of the backlight module disposed opposite to each other, wherein the first surface of the backlight module is attached to the second surface of the display panel; a circuit board including an end attached to the first surface of the display panel and another end bent to the second surface of the backlight module; and an adhesive layer including a first surface and a second surface disposed opposite to each other, wherein the first surface of the adhesive layer is bonded to a side of the backlight module close to the circuit board, and the second surface of the adhesive layer is bonded to the circuit board.

7 Claims, 5 Drawing Sheets

(58) Field of Classification Search
USPC .......................................................... 361/749
See application file for complete search history.

(56) References Cited

U.S. PATENT DOCUMENTS

| | | | |
|---|---|---|---|
| 2019/0219863 A1* | 7/2019 | Tezen | ................. G02F 1/13452 |
| 2020/0183219 A1 | 6/2020 | Tanaka et al. | |
| 2020/0404773 A1* | 12/2020 | Uogishi | ................. H05K 1/189 |

FOREIGN PATENT DOCUMENTS

| | | |
|---|---|---|
| CN | 105785616 A | 7/2016 |
| CN | 108230909 A | 6/2018 |
| CN | 109872635 A | 6/2019 |
| CN | 110012587 A | 7/2019 |
| CN | 110047397 A | 7/2019 |
| CN | 110286794 A | 9/2019 |
| CN | 209928184 U | 1/2020 |
| CN | 210136673 U | 3/2020 |
| KR | 20140116729 A | 10/2014 |

\* cited by examiner

DISPLAY DEVICE

FIELD OF INVENTION

The present application specifically relates to a display device.

BACKGROUND OF INVENTION

Conventional display device design usually bends a flexible circuit board from a surface of a display panel to a surface of a backlight module to reduce a frame ratio on a front of the display panel. However, flexible circuit board materials are flexible, as shown in FIG. 1, FIG. 1 is a schematic diagram of a display device in a conventional art. When a circuit board 30 is bent, it has a greater bending radius, so a distance defined between a backlight module 20 and a circuit board 30 is too large, which causes a frame of the display device to be too large and a screen-to-body ratio to be relatively small.

SUMMARY OF INVENTION

Technical Problem

The present invention provides a display device configured to solve the technical problems in the conventional art that due to an excessively large distance defined between a circuit board and a backlight module when the circuit board is bent, a frame of the display device is too large and a screen-to-body ratio is relatively small.

Technical Solutions

The technical solution to solve the above technical problems is as follows. The present invention provides a display device including a display panel, the display panel includes a first surface and a second surface disposed opposite to each other; a backlight module including a first surface and a second surface disposed opposite to each other, wherein the first surface of the backlight module is attached to the second surface of the display panel; a circuit board including an end attached to the first surface of the display panel and another end bent to the second surface of the backlight module; and an adhesive layer including a first surface and a second surface disposed opposite to each other, wherein the first surface of the adhesive layer is bonded to a side of the backlight module close to the circuit board, and the second surface of the adhesive layer is bonded to the circuit board.

Furthermore, the display panel further includes a display region positioned in a middle of the first surface of the display panel; and a non-display region disposed surrounding the display region, wherein the end of the circuit board is connected to the non-display region.

Furthermore, the circuit board includes a bonding part connected to the non-display region of the display panel; a bending part connected to the bonding part and disposed opposite to the side of the backlight module; and a component part connected to the bending part and disposed opposite to the second surface of the backlight module.

Furthermore, the bending part includes a bending plane, and a surface of the bending plane is bonded to the adhesive layer.

Furthermore, the backlight module includes a first corner defined by a junction of the first surface of the backlight module and the side of the backlight module; and a second corner defined by a junction of the first surface of the backlight module and the side of the backlight module.

Furthermore, the bending part includes two bending corners positioned corresponding to the first corner and the second corner of the backlight module respectively.

Furthermore, the display device further including a plurality of through holes defined in the bending part, wherein the through holes are positioned at the bending corners.

Furthermore, a distance defined between adjacent two of the through holes is greater than a width of any of the through holes.

Furthermore, a radial cross-sectional shape of the through holes is at least one of circular, rhomboid, or elliptical.

Furthermore, a width of the through holes ranges from 0.05 mm to 0.1 mm.

Beneficial Effect

The beneficial effect of the present invention is that when the circuit board is bent to a back of the backlight module in the display device of the present invention, the backlight module and the bending part of the circuit board are bonded together through the adhesive layer, which greatly reduces the distance defined between of the circuit board and the backlight module, and reduces a frame size of the display device. At the same time, a number of through holes are defined in the bending part of the circuit board to release a concentrated stress of the circuit board at the corners of the bending part, preventing the circuit board from being broken due to stress concentration on a certain part of the bending part, which is beneficial to improving the service life of the circuit board.

BRIEF DESCRIPTION OF FIGURES

The following detailed description of the specific embodiments of the present application in conjunction with the accompanying drawings will make the technical solutions and other beneficial effects of the present application obvious.

Figure 1:
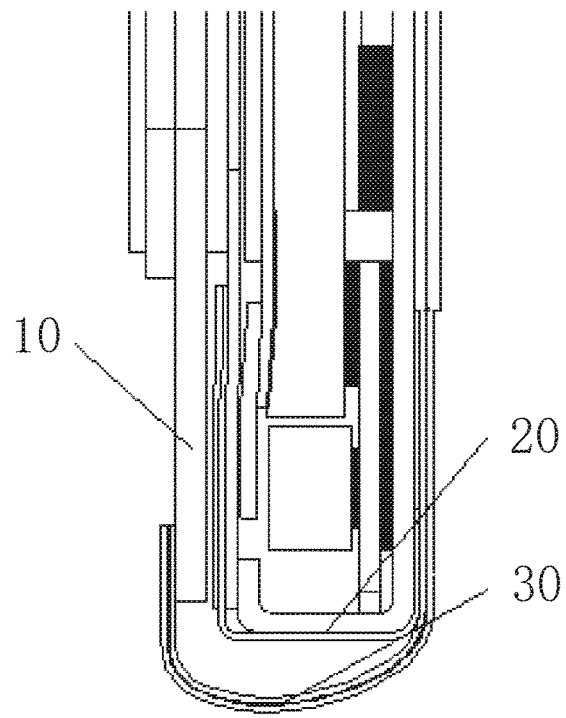
FIG. 1 is a schematic diagram of a display device according to a conventional art.

The part numbers labeled in the figures are as follows:
display panel 10; backlight module 20;
circuit board 30; adhesive layer 40;
first surface of display panel 11; second surface of display panel 12;
first surface of display module 21; second surface of display module 22;
first surface of adhesive layer 41; second surface of adhesive layer 42;
display region 101; non-display region 102;
bonding part 31; bending part 32;

component part 33; bending plane 321; bending corner 322; through hole 34; and corner 23.

DETAILED DESCRIPTION OF EMBODIMENTS

The technical solutions according to embodiments of the present application will be clearly and completely described below in conjunction with the drawings according to embodiments of the present application. Obviously, the described embodiments are only a part of the embodiments of the present application, rather than all the embodiments. Based on the embodiments in the present application, all other embodiments obtained by those skilled in the art without creative work shall fall within the protection scope of the present application.

Embodiments

Figure 2:
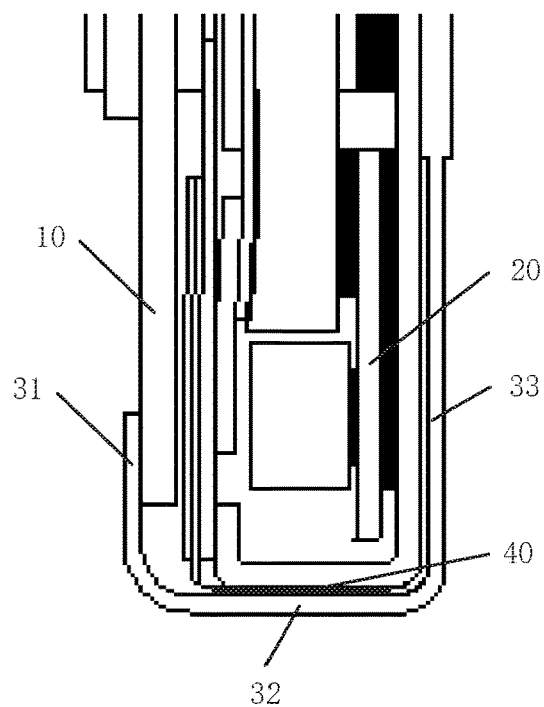
FIG. 2 is a schematic diagram of a display device according to an embodiment.

As shown in FIG. 2, in the present embodiment, a display device of the present invention includes a display panel 10, a backlight module 20, a circuit board 30, and an adhesive layer 40.

Figure 4:
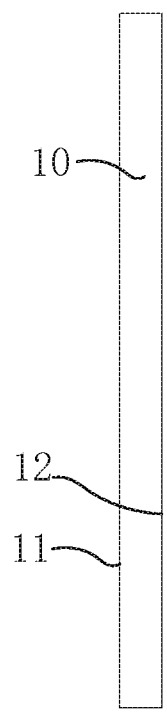
FIG. 4 is a lateral view of a display panel according to an embodiment.
Figure 8:
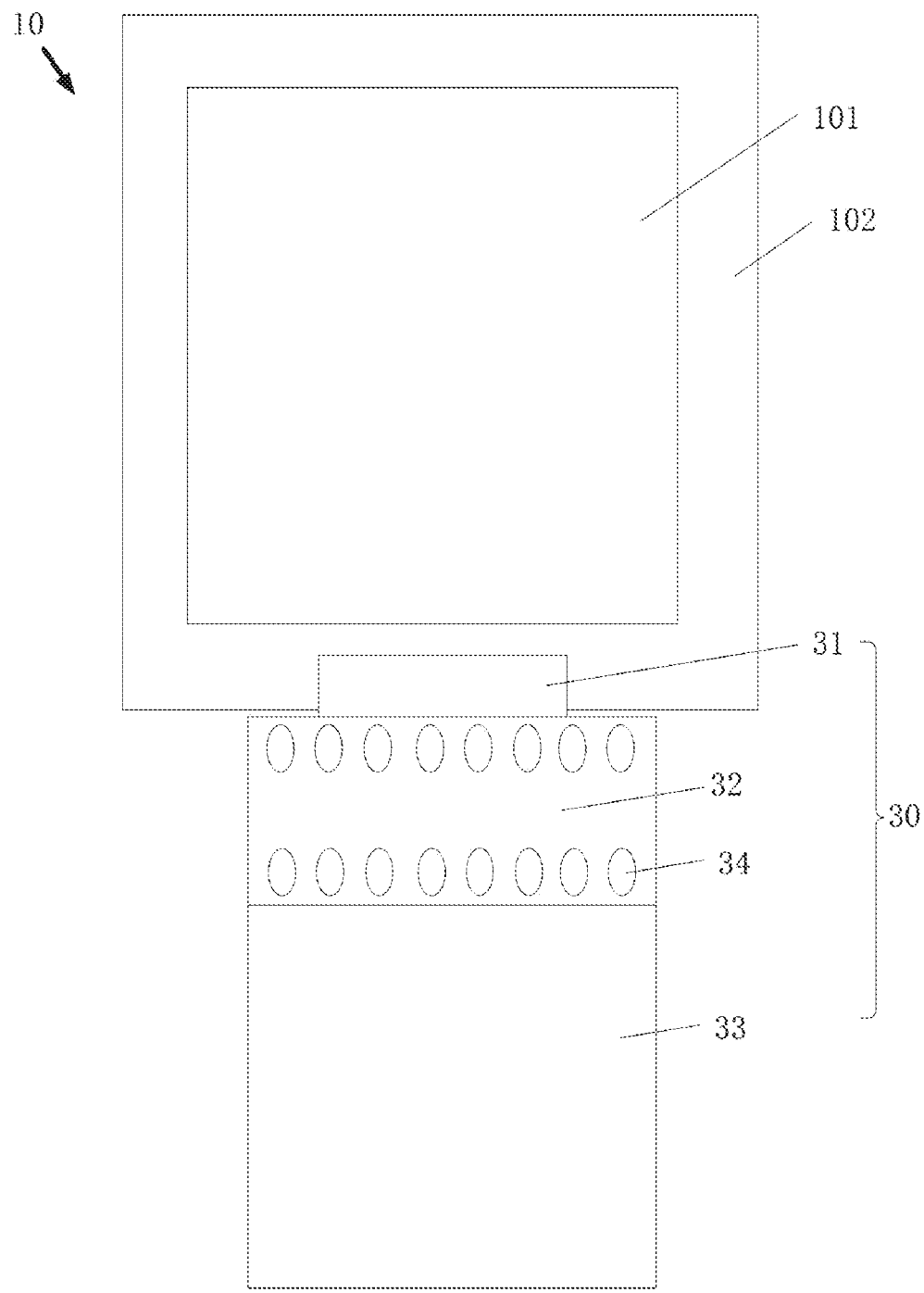
FIG. 8 is a schematic structural diagram of the display panel and the circuit board according to an embodiment.

As shown in FIG. 4 and FIG. 8, the display panel 10 includes a first surface of the display panel 11 and a second surface of the display panel 12 disposed opposite to each other. The first surface of the display panel 11 is a display surface, and is configured to display images. Specifically, the first surface of the display panel 11 includes a display region 101 and a non-display region 102. The display region 101 is positioned in a middle of the first surface of the display panel 11, and its region occupies 90%-95% of the first surface of the display panel 11, thereby achieving a high screen-to-body ratio of the display panel 10. The non-display region 102 is disposed surrounding the display region 101 to accommodate non-luminous traces positioned in the display panel 10, and an entire non-display region 102 is covered by a light-shielding material to prevent the non-display region 102 from light leakage.

Figure 5:
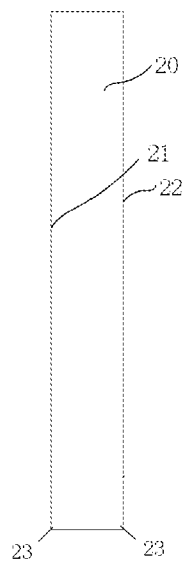
FIG. 5 is a lateral view of a backlight module according to an embodiment.

As shown in FIG. 5, the backlight module 20 includes a first surface of the backlight module 21 and a second surface of the backlight module 22 disposed opposite to each other. The first surface of the backlight module 21 is attached to the second surface of the display panel 12. The first surface of the backlight module 21 is a light-emitting surface, the light-emitting surface is disposed to face the display panel 10, and a light-emitting source is disposed inside the backlight module 20. Light emitted from the light-emitting source is irradiated into the display panel 10 through the light-emitting surface, so that the first surface of the display panel 11 of the display panel 10 can display images.

Figure 6:
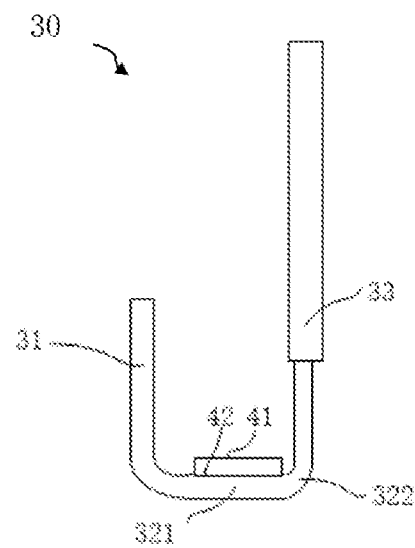
FIG. 6 is a schematic structural diagram of the circuit board and an adhesive layer according to an embodiment.

As shown in FIG. 6, the circuit board 30 includes a bonding portion 31, a bending portion 32, and a component portion 33, wherein a plurality of metal pins are distributed on the bonding portion 31, and the metal pins are bonded in the non-display region 102 of the display panel 10, specifically, in the non-display region 102 of the display panel 10, there are a number of cross-sectional surfaces of metal traces positioned corresponding to the metal pins, and the cross-sectional surfaces of metal traces are connected to the metal pins, so that the circuit board 30 can transmit electrical signals to the display panel 10 to realize a driving display of the display panel 10.

In order to further reduce a proportion of the non-display region 102 of the display panel 10, the circuit board 30 usually adopts a flexible circuit board, and the circuit board 30 is bent from the first surface of the display panel 11 of the display panel 10 to the second surface of the backlight module 22 of the backlight module 20. However, in a bending process, due to an elasticity of the circuit board 30, the bending part 32 of the circuit board 30 will bend toward the backlight module 20 with a certain bending radius, so that a certain gap exists between the bending part 32 and a side of the backlight module 20. The gap will cause a frame ratio of an entire display device to be too great, which is not beneficial to achieving an effect of an ultra-narrow frame.

Figure 7:
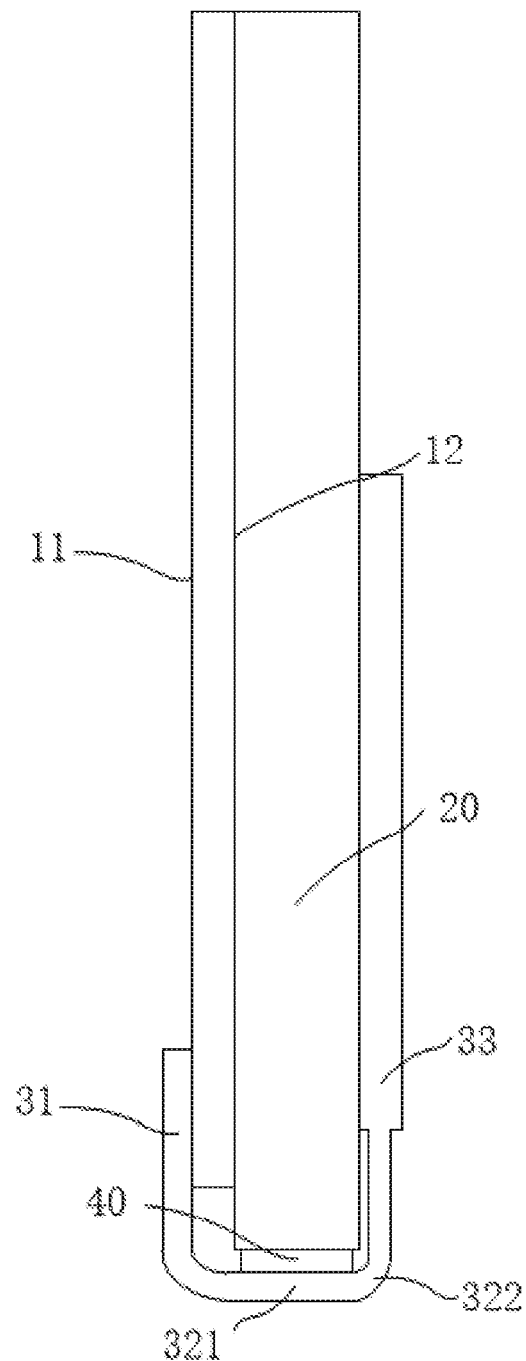
FIG. 7 is a lateral view of the display device according to an embodiment.

As shown in FIG. 6 and FIG. 7, in the present embodiment, an adhesive layer 40 is formed on the side of the backlight module 20. The adhesive layer 40 has a double-sided adhesive effect. In other preferred embodiments of the present invention, the adhesive layer 40 is a double-sided adhesive material. The adhesive layer 40 includes a first surface of the adhesive layer 41 and a second surface of the adhesive layer 42 disposed opposite to each other. The first surface of the adhesive layer 41 is bonded to the side of the backlight module 20 positioned opposite to the circuit board 30, and the second surface of the adhesive layer 42 is bonded to the circuit board 30. An adhesive ability of the adhesive layer 40 can overcome the elasticity of the circuit board 30 itself, so that the bending part 32 of the circuit board 30 can be attached to the side of the backlight module 20, which greatly reduces the gap existing between the backlight module 20 and the bending part 32 of the circuit board 30, and reduces the frame ratio of the display device.

Figure 3:
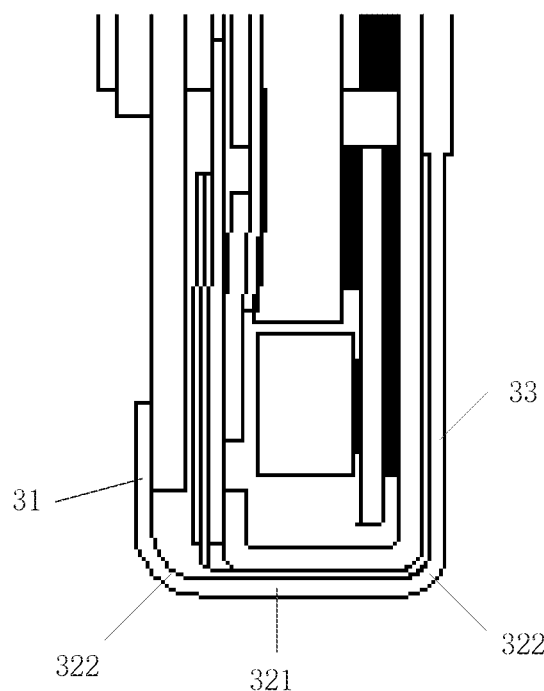
FIG. 3 is a schematic structural diagram of a circuit board according to an embodiment.

Specifically, as shown in FIG. 3, when the bending portion 32 is attached to the adhesive layer 40, a bending plane 321 and two bending corners 322 are formed. The bending corners 322 are positioned corresponding to two corners 23 of the backlight module 20. Wherein, the bending plane 321 is a part in contact with the adhesive layer 40, and the bending plane 321 is tightly attached to the side of the backlight module 20 through the adhesive layer 40. The two bending corners 322 are respectively defined on two ends of the bending plane 321, and are connected to the bonding part 31 and the component part 33, respectively. Meanwhile, all of or partial of bending stress of an entire circuit board 30 is concentrated at the two bending corners 322, resulting in excessive stress at the bending corners 322. In order to relieve the stress at the bending corners 322, as shown in FIG. 8, in the present embodiment, a number of through holes 34 are defined in the two bending corners 322. An arrangement direction of the through holes 34 is parallel to a bending center line of the bending corners 322, and a radial cross-sectional shape of the through holes 34 is circular, elliptical, or rhomboid. When the circuit board 30 is bent, the through holes 34 defined at the bending corners 322 can be deformed to a certain extent to achieve an effect of releasing the stress at the bending corners 322, preventing the circuit board 30 from breaking due to excessive stress occurred at the two bending corners 322. In order to prevent a size of the through holes 34 from affecting a bending service life of the circuit board 30, in the present embodiment, the size of the through holes 34 ranges from 0.05 mm to 0.1 mm, and a distance defined between adjacent two of the through holes 34 is greater than the size of any through hole 34.

The component part 33 is disposed on the second surface of the backlight module 22 of the backlight module 20. Specifically, a number of circuit elements and patterned traces are disposed on a surface of the component part 33 facing the backlight module 20 to transmit and process electrical signals.

The beneficial effect of the present embodiment is that, when the circuit board is bent to a back of the backlight module in the display device of the present embodiment, the backlight module and the bending part of the circuit board are bonded together through the adhesive layer, which greatly reduces the distance defined between of the circuit board and the backlight module, and reduces the frame ratio of the display device. At the same time, a number of through holes are defined in a bending region of the circuit board to release a concentrated stress of the circuit board at the bending region, which is beneficial to improving the service life of the circuit board.

Embodiments of the present invention have been described, but not intended to impose any unduly constraint to the appended claims. For a person skilled in the art, any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A display device, comprising:
    a display panel comprising a first surface and a second surface disposed opposite to each other;
    a backlight module comprising a first surface and a second surface disposed opposite to each other, wherein the first surface of the backlight module is attached to the second surface of the display panel;
    a circuit board comprising an end attached to the first surface of the display panel and another end bent to the second surface of the backlight module; and
    an adhesive layer comprising a first surface and a second surface disposed opposite to each other, wherein the first surface of the adhesive layer is bonded to a side of the backlight module close to the circuit board, and the second surface of the adhesive layer is bonded to the circuit board;
    wherein the circuit board further comprises:
        a bonding part connected to the non-display region of the display panel;
        a bending part connected to the bonding part and disposed opposite to the side of the backlight module; and
        a component part connected to the bending part and disposed opposite to the second surface of the backlight module;
    wherein the bending part comprises two bending corners positioned corresponding to the first corner and the second corner of the backlight module, respectively;
    wherein a plurality of through holes are defined in the bending part, and the through holes are positioned at the bending corners.

2. The display device according to claim 1, wherein the display panel further comprises:
    a display region positioned in a middle of the first surface of the display panel; and
    a non-display region disposed surrounding the display region, wherein the end of the circuit board is connected to the non-display region.

3. The display device according to claim 1, wherein the bending part comprises a bending plane, and a surface of the bending plane is bonded to the adhesive layer.

4. The display device according to claim 1, wherein the backlight module further comprises:
    a first corner defined by a junction of the first surface of the backlight module and the side of the backlight module; and
    a second corner defined by a junction of the first surface of the backlight module and the side of the backlight module.

5. The display device according to claim 1, wherein a distance defined between adjacent two of the through holes is greater than a width of any of the through holes.

6. The display device according to claim 1, wherein a radial cross-sectional shape of the through holes is at least one of circular, rhomboid, or elliptical.

7. The display device according to claim 1, wherein a width of the through holes ranges from 0.05 mm to 0.1 mm.

* * * * *